United States Patent [19]

Varker et al.

[11] Patent Number: 4,683,637
[45] Date of Patent: Aug. 4, 1987

[54] FORMING DEPTHWISE ISOLATION BY SELECTIVE OXYGEN/NITROGEN DEEP IMPLANT AND REACTION ANNEALING

[75] Inventors: Charles J. Varker, Scottsdale; Syd R. Wilson; Marie E. Burnham, both of Phoenix, all of Ariz.

[73] Assignee: Motorola, Inc., Schaumburg, Ill.

[21] Appl. No.: 826,951

[22] Filed: Feb. 7, 1986

[51] Int. Cl.$^4$ .................. H01L 21/265; H01L 7/54
[52] U.S. Cl. ..................... 437/63; 357/23.4; 148/DIG. 77; 437/24; 437/40
[58] Field of Search .................. 29/571, 576 B, 576 T; 148/1.5, 187

[56] References Cited

U.S. PATENT DOCUMENTS

| | | | |
|---|---|---|---|
| 4,412,868 | 11/1983 | Brown et al. | 148/1.5 |
| 4,498,224 | 2/1985 | Maeguchi | 29/571 |
| 4,523,213 | 6/1985 | Konaka et al. | 357/23.7 |
| 4,596,605 | 6/1986 | Nishizawa et al. | 148/1.5 |

FOREIGN PATENT DOCUMENTS

| | | | |
|---|---|---|---|
| 0042552 | 12/1984 | European Pat. Off. | |
| 8406232 | 4/1984 | France | |
| 2563377 | 10/1985 | France | |
| 0016586 | 2/1978 | Japan | 357/23 CS |
| 5316586 | 7/1979 | Japan | 27/04 |
| 54-55870 | 8/1979 | Japan | 29/78 |
| 55-83263 | 6/1980 | Japan | |
| 55-148464 | 11/1980 | Japan | |
| 0089868 | 5/1983 | Japan | 357/23.1 |
| 58-89868 | 11/1984 | Japan | 29/78 |
| 00/00694 | 2/1985 | PCT Int'l Appl. | |

OTHER PUBLICATIONS

Wada et al., Jap. Journ. Appl. Phys. 15 (1976) 1725.
Hezel et al., Thin Solid Films 124 (1985) 35, IBM-TDB, vol. 27 (12), May 1985, p. 6866.
IBM-TDB, vol. 27, (11), Apr. 1985 p. 6707.
Arienzo et al., IBM-TDB, vol. 27, Sep. 1984, p. 2371.

Primary Examiner—Upendra Roy
Attorney, Agent, or Firm—Robert M. Handy

[57] ABSTRACT

MOS transistors in which the source and drain contact are isolated from the common substrate are formed by using the gate conductor to mask a high dose high energy implant which creates a thin dielectric region within the body of the common substrate beneath the source and drain regions, but not beneath the channel region. For single crystal silicon substrates, oxygen and nitrogen are the preferred ions for use in forming the buried dielectric region. The conductive gate must be sufficiently thick so as to preclude the implanted oxygen or nitrogen ions from reaching the underlying gate dielectric or the portion of and channel region of the device will be substantially free the substrate beneath the gate. This ensures that the gate and channel region of the device will be substantially free of the implant damage which otherwise occurs during formation of the buried dielectric regions. Dielectric isolation walls are conveniently provided laterally exterior to the source-drain regions. The source-drain and gate regions are self-aligned to each other. Typical oxygen implant doses to form the buried dielectric layer are $1.7$–$2.2 \times 10^{18}$ ions/cm$^2$ at an energy of about 150 KeV.

7 Claims, 12 Drawing Figures

FORMING DEPTHWISE ISOLATION BY SELECTIVE OXYGEN/NITROGEN DEEP IMPLANT AND REACTION ANNEALING

BACKGROUND OF THE INVENTION

1. Field of the Invention

This invention relates in general to means and methods for semiconductor devices and, more particularly to means and methods for partially dielectrically isolated, self-aligned, semiconductor devices.

2. Background Art

As semiconductor devices become smaller and are packed more tightly on a common substrate, parasitic leakage currents and parasitic capacitances associated with junction isolation regions have an increasingly adverse effect on device and circuit performance. Accordingly, there is an increasing need for dielectrically isolated devices.

In the prior art, dielectrically isolated (DIC) devices were formed by first etching a mesh shaped pattern of grooves in the upper surface of a single crystal semiconductor substrate so as to leave islands of single crystal material between the grooves, coating the grooves and the exposed islands with a dielectric layer, covering the dielectric layer with a thick polycrystalline layer, and then grinding away the single crystal substrate so as to expose the islands of single crystal material. This provided a structure in which each single crystal island was surrounded by a dielectric region embedded in a polycrystalline matrix. Individual devices could then be fabricated in the individual single crystal semiconductor islands. While this arrangement was satisfactory for building low density integrated circuits, particularly radiation hardened integrated circuits, it has not proved well suited to high density and large scale integrated circuits.

More recently, dielectrically isolated circuits have been prepared by taking a single crystal substrate, blanket implanting a very high dose of oxygen at an energy sufficient to place the peak of the implanted oxygen distribution well below the substrate surface. The implanted oxygen forms a thin buried dielectric layer. The implanted substrate is heated so as to anneal, in so far as possible, the structural damage in the single crystal semiconductor region between the surface and the implanted dielectric layer.

While this approach has permitted higher density circuits to be fabricated, it suffers from a number of significant disadvantages. For example, the very high implant doses required to form the buried insulating layer cause substantial crystal damage in the overlying single crystal region. Even after annealing, the dislocation densities are extremely high. These dislocations create undesirable parasitic leakage currents that degrade device and circuit performance. Further, when MOS devices are fabricated in the single crystal layer above the buried dielectric region, it is extremely difficult to provide a backgate bias contact to the individual devices since the prior art buried dielectric region extends under the gate and channel region as well as under the contacts. This makes it difficult or impossible to use the body effect to vary device performance.

Thus, there is a continuing need for improved means and methods for fabricating dielectrically isolated devices. Accordingly, it is an objective of the present invention to provide an improved means and method for dielectrically isolated devices where the dielectric isolation region extends under the terminals or contact portion of the device but not under the active regions.

It is an additional objective of the present invention to provide an improved means and method for dielectrically isolated MOS devices where the implanted dielectric isolation region is provided under the source and drain regions but not under the channel region.

It is a further objective of the present invention to provide an improved means and method for dielectrically isolated devices that provides self-aligned source, drain, and gate regions while avoiding implant damage under the gate region.

It is an additional objective of the present invention to provide an improved means and method for dielectrically isolated MOS devices where a common body contact can be maintained to the MOS channel regions through a conductive substrate.

It is a further objective of the present invention to provide an improved means and method for dielectrically isolated MOS devices wherein the gate dielectric and/or the channel region are protected from direct implanted damage during formation of the buried dielectric isolation layer.

SUMMARY OF THE INVENTION

The attainment of the foregoing and other objects and advantages is achieved through the present invention wherein there is provided a single crystal semiconductor substrate having a first surface; a first insulating dielectric region (e.g., a gate insulator) on a portion of the first surface; a conductor means (e.g., a gate electrode) above the first dielectric region; first and second single crystal semiconductor regions (e.g., source and drain regions) in the substrate extending below the first surface a first pre-determined distance and lying on either side of the first dielectric region; second insulating dielectric regions (e.g., buried dielectric isolation regions) in the substrate underlying the first and second single crystal semiconductor regions and not substantially extending under the first dielectric region; and third dielectric regions (e.g., lateral isolation walls) in the substrate extending from the surface to the second dielectric regions and laterally separated from the first dielectric region by the first and second single crystal semiconductor regions.

There is further provided a method for fabricating a semiconductor device (e.g., a field effect transistor) comprising: providing a single crystal semiconductor substrate having a first surface; forming on or above the first surface a gate conductor means having a first pre-determined thickness and overlying a first region of the substrate and not overlying a first region of substrate; and implanting oxygen or nitrogen into a first part of the second region of the substrate to a dose exceeding about $1 \times 10^{18}$ ions/cm$^2$, preferably exceeding about $1.7 \times 10^{18}$ ions/cm$^2$, to form a buried dielectric layer in the second region, wherein the implant energy is sufficient to cause the ions to penetrate into the substrate to a second pre-determined depth and not penetrate through the gate conductor means into the first region of the substrate. It is desirable to include the step of forming lateral dielectric isolation walls extending from the first surface to the buried dielectric layer. These lateral dielectric isolation walls may be formed before or after forming the buried dielectric layer.

The details of the present invention are more completely described in the figures and explanation which follow.

DETAILED DESCRIPTION OF THE DRAWINGS

For purposes of explanation, the device structures and methods herein are illustrated for the case of silicon based semiconductor devices using silicon oxide and silicon nitride dielectric layers and polysilicon layers. However, those of skill in the art will understand that the described means and methods apply to other semiconductor substrates, other dielectric materials, and other polcrystalline semiconductor layers, and that the illustrated examples are merely presented as an aid to understanding and not intended to be limiting, and that other materials may also be used.

In FIGS. 1-11, unless otherwise noted, dielectric layers or regions are shown hatched, polycrystalline semiconductor regions are shown stippled, and single crystal regions, metal layers, and masking layers are shown clear. Arrows are used to indicate conventional implantation and/or bombardment etching techniques, such as for example, reactive ion etching or ion milling. It will be understood by those of skill in the art that masking, etching, and doping may be carried out by other means well known in the art.

FIGS. 1-4, 4A, and 5-11 show in simplified schematic cross-sectional form, a portion of a semiconductor device according to the present invention during different stages of fabrication and for different embodiments. The means and method of the present invention are best understood by considering the figures sequentially.

Figure 1:
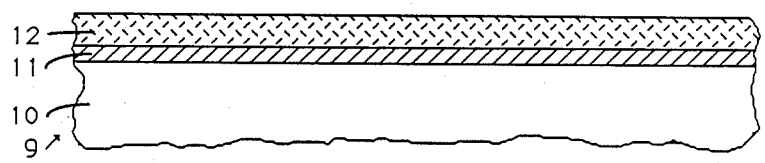
FIGS. 1-4, 4A, and 5-11 show simplified schematic cross-sectional views of a portion of a semiconductor device, according to the present invention, at different stages of fabrication, and according to different embodiments.

In FIG. 1, device portion 9 consists of substrate 10 of, for example, single crystal silicon, on which has been provided dielectric layers 11 and 12. Dielectric layer 11 is, for silicon substrates, conveniently formed of silicon dioxide. Thicknesses of layer 11 in the range 0.01–0.08 microns are useful. However, larger or smaller thicknesses may also be used. Layer 12 is conveniently formed of silicon nitride of a thickness in the range 0.05–0.3 microns. It is important that layer 12 be resistant to oxygen migration, since in a subsequent step it will be used to locally control the oxidation of substrate 10. Layer 12 may be of any material which provides this oxidation masking function and does not otherwise contaminate substrate 10.

Figure 2:
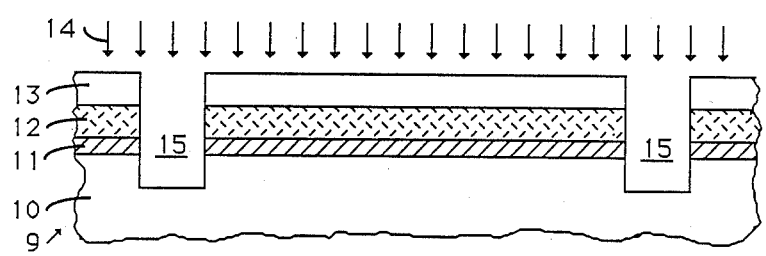
Figure 3:
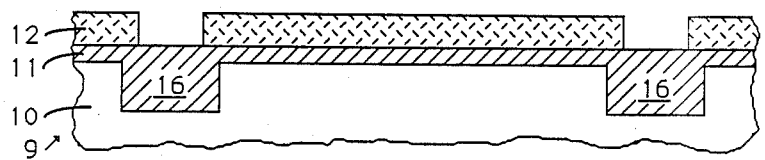

Layer 12 is covered with masking layer 13 (FIG. 2) of any convenient material. Photoresist is a typical example. Layer 13 is patterned to provide openings as indicated in FIG. 2 through which holes 15 are etched successively in layers 12, and 11 so as to locally expose portions of the surface of substrate 10. Means for etching layers 12 and 11 are well known in the art. Trenches 15 are then etched in substrate 10, for example by reactive ion etching as indicated by arrows 14. Trenches 15 are then filled with dielectric regions 16 as indicated in FIG. 3. Each dielectric region 16 serves as a lateral isolation wall. This is conveniently accomplished by oxidation of substrate 10, but other means well known in the art may also be used. Where isolation walls 16 are formed by oxidation, layer 12 serves as an oxidation mask to prevent generalized oxidation of substrate 10 (see FIG. 3). It is desirable that trenches 15 be filled so that the surfaces of dielectric isolation walls 16 are substantially level with the surface of dielectric layer 11, however this is not essential.

Figure 4:
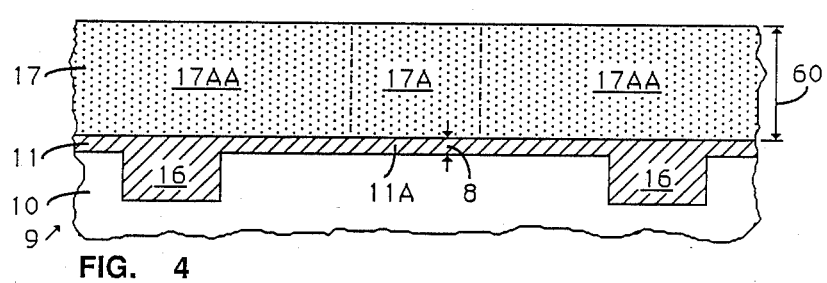

Isolation walls 16 and dielectric layer 11 are then covered with conductor layer 17 of thickness 60, as shown in FIG. 4. Layer 17 is conveniently of, for example, polycrystalline silicon, but other conductor materials may also be used. As will be subsequently explained, region 11a of device portion 9 may conveniently serve as the gate dielectric of a MOSFET. Thickness 8 of dielectric layer 11 may be chosen so that it provides the desired thickness for the gate insulator, however this is not essential.

Figure 4A:
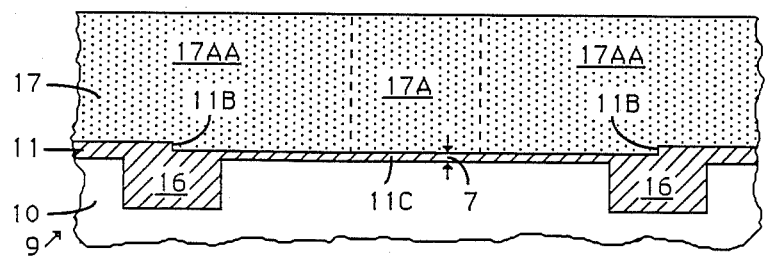

As illustrated in the alternative embodiment shown in FIG. 4A, the central portion of layer 11 between edges 11b may be striped from substrate 10 prior to depositing layer 17 and new dielectric layer 11c of any desired thickness 7 formed in central region 11b—11b between isolation walls 16. Dielectric layer portion 11c may be formed by oxidation of substrate 10 or by any other convenient technique and may be of any desired material. Means for stripping the central portion of dielectric layer 11 and providing new dielectric layer 11c are well known in the art and are conventional. Alternatively, layer 11 in FIGS. 1-4 may be omitted and layer 12 placed directly on substrate 10. If an oxide or other dielectric layer analogous to layer 11 is needed on substrate 10 for other purposes, it may be formed at the same time as layer 11c. However, dielectric region 11c is not essential and may be omitted. JFETS, MESFETS, and bipolar transistors are examples of devices which do not require an insulator such as dielectric region 11c. For the remainder of the process description in connection with FIGS. 5-11, it is assumed that the configuration illustrated in FIG. 4 has been utilized. Those of skill in the art will understand that other configurations could equally well have been employed.

Figure 5:
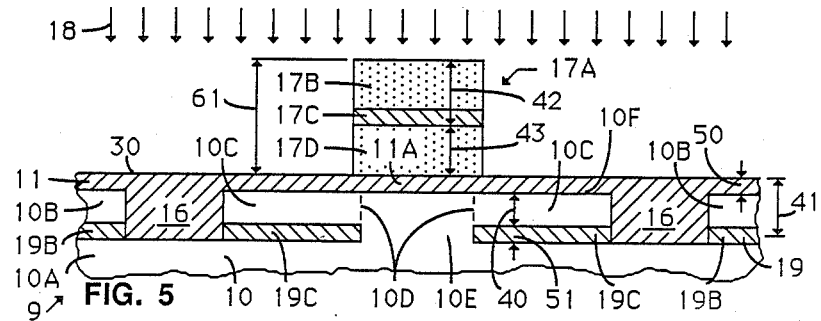

A masking layer (not shown) is formed on layer 17 so as to cover or protect portions 17a while leaving portions 17aa exposed (FIG. 4). Portions 17aa are then removed while portion 17a is left substantially undisturbed (FIG. 5). Masking and etching techniques for removing portions 17aa while leaving portion 17a undisturbed are well known in the art and are conventional. It is desirable to employ masking and etching procedures which provide substantially vertical sidewalls on portion 17a. Reactive ion etching and ion milling are examples of known techniques for producing substantially vertical sidewalls but others may also be used.

Following removal of portions 17aa, remaining portion 17a and exposed surface 30 of dielectric layer 11 on substrate 10 are implanted with ions 18 of, for example, oxygen or nitrogen or mixtures thereof, to a dose sufficient to form buried dielectric layer or region 19. The implant energy must be sufficient to locate buried dielectric layer 19 at depth 40 below surface 10f of substrate 10. Doses of oxygen or nitrogen or a combination thereof exceeding about $1 \times 10^{18}$ ions/cm$^2$ are necessary to form buried dielectric region 19. Doses in the range $1.7-2.2 \times 10^{18}$ ions/cm$^2$ are convenient. Energies exceeding about 80 KeV are useful, with 150 KeV being typical. Higher energies can also be used. It is convenient to carry out the oxygen/nitrogen implant through dielectric layer 11.

The dose and energy are selected, using means well known in the art, so that portions 10b–c of substrate 10 having thickness 40 lie between buried dielectric layer 19 and surface 10f of substrate 10. For oxygen (O+) implanted in silicon substrate 10 through surface oxide 11, range 41 to the center of implanted region of layer 19 is about 0.37 microns at 150 KeV. This range includes thickness 50 of about 0.025 microns for covering oxide 11. Increasing the dose beyond the levels indicated above increases thickness 51 of buried dielectric layer 19. Increasing the implant energy increases distance 41 from exposed surface 30 to the center of implanted dielectric layer 19.

The quality of implanted buried dielectric layer 19 and the quality of overlying single crystal regions 10b–c are improved by annealing the structure after oxygen or nitrogen implantation. Annealing removes some of the implant damage created in single crystal regions 10b-c above buried dielectric layer 19 as a result of the oxygen or nitrogen implant, and also densifies buried dielectric layer 19. In general, some implant damage or dislocations always remain in regions 10b–c.

Annealing temperatures exceeding about 1000° C. are desirable, with temperatures exceeding 1100° C. being preferred and about 1150° C. being convenient. Annealing time varies inversely with temperature, the higher the temperature the shorter the time required to obtain a given annealing effect. At 1150° C., for example, annealing times in the range 1–4 hours are satisfactory. However, as those of skill in the art will recognize, longer or shorter times can also be used with lower or higher temperatures. For example, 2–3 minutes at about 1400° C. has about the same effect as 1–2 hours at 1100°–1500° C. However, for extended times at high temperatures the implanted oxygen or nitrogen will tend to diffuse to the surface and the buried dielectric layer may become thinner. Accordingly, temperatures of about 1400° C. for times greater than about 30–60 minutes are not desirable. Annealing of the oxygen/nitrogen implant is conveniently carried out in an inert ambient, e.g. argon. A small amount of oxygen may be added briefly to promote regrowth of any part of layer 11 which has been eroded by sputtering during the oxygen/nitrogen implant.

It is convenient to perform the above-described annealing step prior to implanting localized conductivity altering dopants into substrate 10. Annealing the oxygen/nitrogen implant damage prior to doping avoids having the oxygen/nitrogen annealing step cause redistribution of the dopants. However, this is not essential.

It is desirable to use a blanket implant for ions 18. When a blanket implant is employed then buried dielectric zone 17c is formed in region 17a at the same time as buried dielectric layer 19 is formed in substrate 10 (see FIG. 5). Since it is an objective of the present invention to avoid implant damage in region 10e undeneath dielectric portion 11a and conductor portion 17a, thickness 61 of conductor region 17a must be larger than implant depth 42 in the material of conductor 17. As is shown in FIG. 5, dielectric zone 17c formed by implanted ions 18 in conductor portion 17a lies at distance 43 away from sensitive dielectric region 11a. While upper portion 17b of region 17a may experience substantial implant damage, lower portion 17d protects underlying regions 11a and 10e so that they are substantially free of direct implant damage.

In substrate 10, regions 10b–c will experience significant implant damage during formation of buried dielectric layer 19. However region 10e of substrate 10 will be substantially free of implant damage from ions 18. This is because region 10e is protected by conductor portion 17a during the oxygen/nitrogen implant. Boundaries 10d of dielectric regions 19c and implant damaged regions 10c may extend slightly under the edges of portion 17a, as illustrated in FIGS. 5–11. This is due in part to scattering effects. However, this slight intrusion is not sufficient to cause the ends of regions 19c to meet under portion 17a for device dimensions of practical interest, so region 10e remains substantially free of oxygen/nitrogen implant damage and remains directly coupled to underlying substrate 10a.

Portion 17b of region 17a is then conveniently removed. Portion 17b may be removed by direct etching, i.e., by etching with an etching means that directly attacks portion 17b, or portion 17b may be removed by lift-off using an etching means which attacks region 17c. Dip etching is convenient. Prior to annealing oxygen/nitrogen implanted region 17c, region 17c is porous and etches more rapidly than dielectric layer 11, even if formed of the same material, e.g. silicon oxide. Thus lift-off etching may be performed without a masking step, although a mask may be used if desired.

Figure 6:
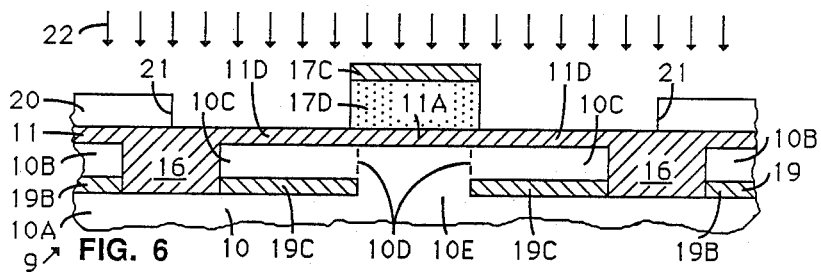
Figure 7:
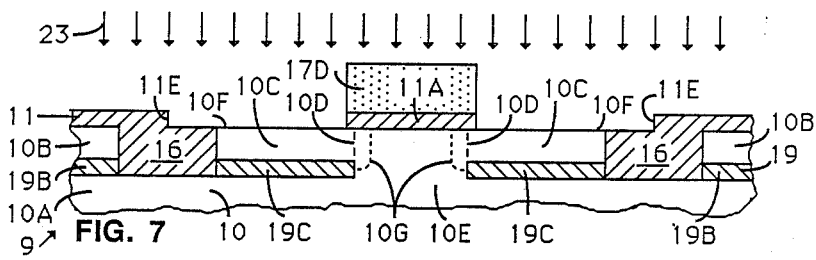

As shown in FIGS. 6–7, mask 20 having opening 21—21 is then applied to layer 11 on substrate 10 by conventional means well known in the art. Using conventional etching technqiues, such as for example reactive ion etching as indicated by arrows 22, portions 11d of oxide layer 11 between edges 11e—11e are removed. If dielectric region 17c has been left in place it is also conveniently removed at the same time. This exposes portion 17d of conductor region 17a and surface 10f of portions 10c of substrate 10 on either side of portion 17d.

Portions 10c and 17d are then conveniently doped, as for example by ion implanation as indicated by arrows 23 (FIG. 7). The substrate is then heated to anneal any residual dopant implant damage and activate the dopant. This results typically in a lateral migration of the dopant placed in regions 10c so that the PN junctions formed by the dopant ions with the material of substrate 10 are at locations 10g under remaining portion 17d of conductor region 17a. (See FIG. 7). Portion 11d of dielectric layer 11 may be left in place during implant doping of regions 10c by ions 23.

The device illustrated in FIG. 7 has conveniently the form of a MOS transistor. Regions 10c form the source and drain and portion 17d forms the gate with portion 11a acting as the gate dielectric. It will be observed from FIG. 7 that source-drain regions 10c are isolated from substrate 10 by dielectric regions 19c and from portions 10b by lateral dielectric isolation walls 16. Portions 10b of substrate 10 are similarly isolated from common region 10a of substrate 10 by dielectric portions 19b of buried dielectric layer 19.

The channel of the MOS device is located between junctions 10g in region 10e. Portion 10a of substrate 10 therefore forms a body or backgate contact to the channel. As will be readily apparent to those of skill in the art, providing dielectric isolation regions 19c under source-drain regions 10c and dielectric isolation walls 16 laterally disposed on either side of regions 10c, substantially reduces the parasitic leakage currents and parasitic capacitances associated with the MOS device. This permits significantly improved device and circuit performance. It will also be apparent that source-drain regions 10c are automatically self-aligned with gate region 17d without need for any separate masking or alignment steps. Further, portion 17d and regions 10c may utilize the minimum resolvable dimensions since it is not necessary to make an alignment therebetween. This permits much higher packing densities and substantially improved circuit performance.

Figure 8:
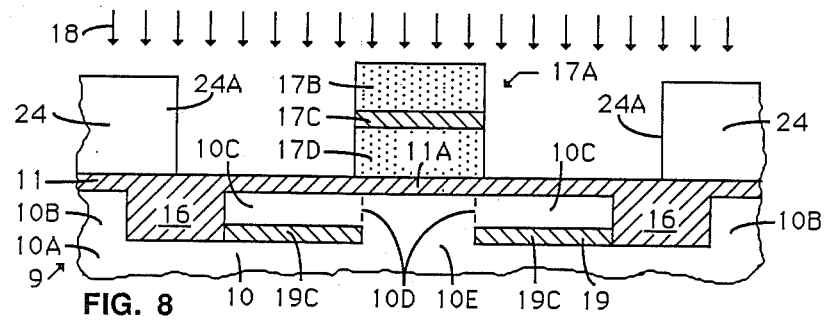
Figure 9:
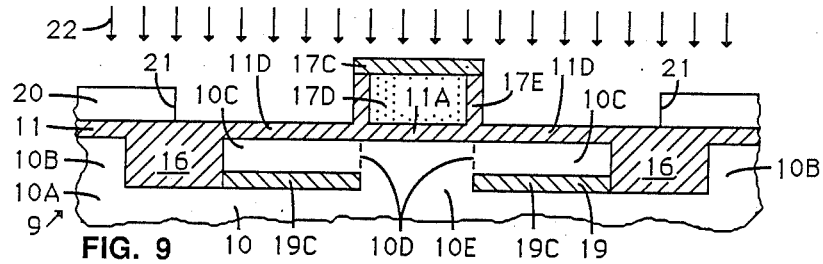
Figure 10:
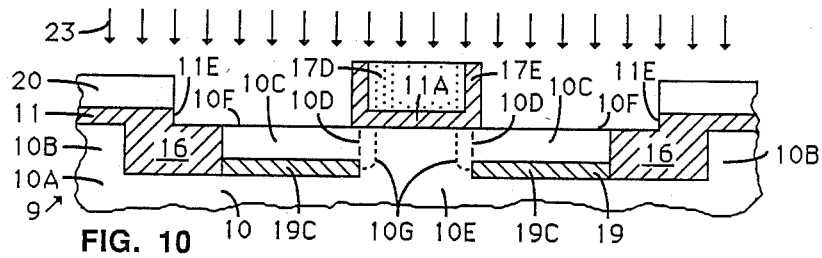

FIGS. 8-11 illustrate an alternate embodiment of the means and method of the present invention. Unless otherwise indicated, FIGS. 8-10 are analogous to FIGS. 5-7, and regions or parts having the same numbers are identical. FIG. 8 differs from FIG. 5 in that thick mask layer 24 having opening 24a is placed over layer 11 on substrate 10 prior to implanting ions 18. Mask 24 must have sufficient thickness so as to prevent ions 18 from reaching substrate 10. Mask 24 with opening 24a—24a need not be precision aligned to the pre-existing images on the wafer since it may be placed anywhere within the lateral extent of dielectric isolation walls 16. The purpose of mask 24 is to prevent ions 18 from forming buried dielectric regions 19b (see FIG. 5) laterally exterior to dielectric isolation walls 16. It may also be used to protect any other portions of substrate 10 from ions 18. Mask 24 may be conveniently formed from high temperature materials such as oxides, nitrides, polysilicon or other refractory materials. High temperature materials are desirable because they are better able to withstand the elevated temperatures generated during the oxygen/nitrogen implant, e.g., 300°-800° C.

FIG. 9 is analogous to FIG. 6 except that sidewall dielectric regions 17e are formed on either side of portion 17d of conductor region 17a. This is conveniently accomplished by oxidation or other means well known in the art. After sidewall dielectric regions 17e have been formed, mask layer 20 is applied and the process proceeds in the same manner as previously described in connection with FIGS. 6 and 7. FIG. 10 is analogous to FIG. 7 and illustrates the configuration when dielectric sidewalls 17e are present at the sides of portion 17d. FIG. 10 also illustrates a further optional embodiment in that mask 20 is left in place during doping of regions 10c and 17d by ions 23. The purpose of mask 20 at this step is to prevent ions 23 from doping portions 10b of substrate 10 laterally outside dielectric isolation wall 16.

Following implant doping of portions 10c and 17d, mask 20 is removed and substrate 10 heated to activate dopant ions 23 and anneal any residual doping implant damage. As previously described this causes the PN junctions formed between doped regions 10c and substrate 10 to move laterally inward to locations 10g. As in the case of the device of FIG. 7, the device of FIG. 10 conveniently forms an MOS transistor.

Figure 11:
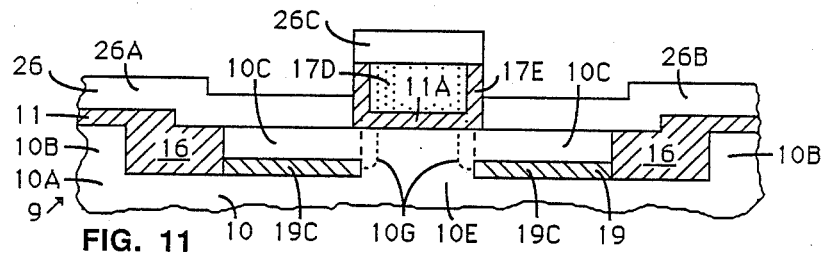

FIG. 11 illustrates the configuration when contact conductors 26 having source contact 26a, drain contact 26b and gate contact 26c are applied to the structure of FIG. 10. The structure of FIG. 11 conveniently forms a MOS transistor in which portions 10c are the source and drain and portion 17d is the gate. The channel region of this MOS transistor is formed under dielectric region 11a in portion 10e of substrate 10. Portion 10a of substrate 10 below dielectric layer 19 provides a common body or backgate contact to the MOS transistors formed in this manner. As noted in connection with device of FIGS. 5-7, portion 17a shields region 10e where the active device behavior takes place from damage due to ions 18 and ions 23 which are used to form buried dielectric layer 19 and to dope regions 10c. This is a significant advantage and substantially improves device behavior.

While the invented means and method have been illustrated in terms of MOS devices built on silicon substrates using buried dielectric layers formed with oxygen and/or nitrogen, those of skill in the art will understand that other materials may be used and other types of devices formed in both silicon and in other semiconductor materials. The means and method of the present invention are particularly useful when it is desired that the active region of the device, e.g., the channel region of a MOSFET, the base or collector blocking region of a bipolar transistor or thyristor, or the depletion region of a diode, be protected during the high dose, high energy implants necessary to form the buried dielectric layer which is to isolate the non-active regions of the device from the common substrate. Even though the active regions of the device remain in contact with the common substrate, the isolation of the contact regions associated therewith substantially reduces the leakage currents and parasitic capacitance of the device and improves overall performance. A significant advantage of the invented means and method as compared to prior art blanket implant structures and methods is the suitability of the invented means and methods for use in CCDs and DRAMs and other devices in which the active device behavior is particularly sensitive to material defects.

It will be apparent to those of skill in the art that in the active regions of the device which are shielded from the oxygen/nitrogen implants, the invented means and method reduces structural defects, reduces or eliminates oxygen donor compensation, improves mobility and minority carrier lifetimes, reduces channel-off currents, reduces parasitic latch-up problems, reduces soft-error charge upsets, and improves thin oxide integrity. A significant advantage over more conventional blanket isolated structures is that a high tolerance to ionizing radiation can be achieved without increasing the number of defects in the sensitive regions of the device. Those of skill in the art will understand that the principles taught herein apply to other semiconductor materials, such as for example, but not limited to, germanium and III-V materials. Accordingly, it is intended to include all such variations in the claims which follow.

We claim:

1. A process for forming a semiconductor device, comprising:

provide a single crystal semiconductor substrate having a first surface;

forming on said surface a conductor means having a first predetermined thickness and overlying a first region of said substrate and not overlying a second region of said substrate;

implanting oxygen or nitrogen into a first part of said second region of said substrate and into said conductor means to a dose exceeding about $1 \times 10^{18}$ ions/cm$^2$ at an energy sufficient to penetrate into said substrate to a first predetermined depth and to penetrate into said conductor means to a second predetermined depth less than said first thickness;

heating said substrate and said conductor means to react said implanted oxygen or nitrogen to form a first buried dielectric at said first depth in said second region and a second buried dielectric at said second depth in said conductor means;

etching away a first part of said conductor means above said second buried dielectric to leave said second dielectric and a second part of said conductor means below said second dielectric; and thereafter etching away said second buried dielectric.

2. The process of claim 1 further comprising after said steps of implanting oxygen or nitrogen and heating to form said first and second buried dielectrics, doping a part of said second region of said substrate with a conductivity altering dopant.

3. The process of claim 1 wherein said heating step comprises heating to a temperature exceeding about 1000° C.

4. The process of claim 1 further comprising forming a dielectric region on said surface under said conductor means.

5. The process of claim 2 further comprising prior to said doping step, forming dielectric isolation walls in another part of said second region of said substrate and extending from said surface to said first buried dielectric in said substrate.

6. A process for forming a partially isolated MOS transistor having source, drain and gate regions, comprising:

providing a single crystal semiconductor substrate having a principle surface;

forming an oxidation resistant masking layer on said surface;

patterning said masking layer to expose first portions of said substrate;

removing said first portions on said substrate to form trenches;

at least partly refilling said trenches with dielectric to form isolation walls having a first depth;

forming above said surface and said refilled trenches a conductor layer having a first thickness exceeding a second depth, wherein said second depth is a predetermined oxygen or nitrogen implant penetration depth in said conductor layer;

removing a first portion of said conductor layer leaving behind a second portion of said conductor layer located between two of said isolation walls;

implanting oxygen or nitrogen into said substrate and said conductor layer at an energy sufficient to penetrate to a third depth in said substrate and to said second depth in said conductor layer, wherein said third depth is less than or equal said first depth, and to a dose sufficient to form dielectric regions by reaction with said substrate and said conductor layer;

heating to react said oxygen or nitrogen with said substrate and said conductor layer to form a first buried dielectric region lying at said second depth in said second portion of said conductor layer and a second buried dielectric region lying at said third depth in said substrate; and etching away said conductor layer above said first buried dielectric region and said first buried dielectric region.

7. The process of claim 6 further comprising, after said step of implanting oxygen or nitrogen, implanting a conductivity altering dopant into said second portion of said conductor layer and into part of said substrate.

* * * * *